United States Patent
Lee et al.

(10) Patent No.: US 6,306,741 B1
(45) Date of Patent: Oct. 23, 2001

(54) METHOD OF PATTERNING GATE ELECTRODES WITH HIGH K GATE DIELECTRICS

(75) Inventors: James Yong Meng Lee; Xia Li; Yun Qiang Zhang, all of Singapore (SG)

(73) Assignee: Chartered Semiconductor Manufacturing, Inc., Milpitas, CA (US)

(*) Notice: Subject to any disclaimer, the term of this patent is extended or adjusted under 35 U.S.C. 154(b) by 0 days.

(21) Appl. No.: 09/615,809

(22) Filed: Jul. 13, 2000

(51) Int. Cl.[7] .................................. H01L 21/3205
(52) U.S. Cl. .................. 438/585; 438/424; 438/426; 438/435
(58) Field of Search ................ 438/424, 426, 438/435, 585

(56) References Cited

U.S. PATENT DOCUMENTS

| | | | |
|---|---|---|---|
| 5,872,038 | 2/1999 | Duane et al. ............... | 438/279 |
| 5,899,719 | 5/1999 | Hong ........................ | 438/289 |
| 5,943,576 | 8/1999 | Kagoor ..................... | 438/302 |
| 5,960,270 | 9/1999 | Misra et al. ............... | 438/197 |
| 5,963,818 | 10/1999 | Kao et al. .................. | 438/424 |
| 6,087,243 | * 7/2000 | Wang ........................ | 438/424 |

* cited by examiner

*Primary Examiner*—David Nelms
*Assistant Examiner*—Reneé R. Berry
(74) *Attorney, Agent, or Firm*—George O. Saile; Rosemary L. S. Pike; Stephen G. Stanton

(57) ABSTRACT

A buffer layer and a gate dielectric layer overlying a substrate having at least one active area is provided. A sacrificial oxide layer is formed over the gate dielectric layer. A nitride layer is formed over the sacrificial oxide layer. The nitride layer is patterned to form an opening therein within the active area exposing a portion of the sacrificial oxide layer within the opening. The portion of the sacrificial oxide layer within the opening is stripped, exposing a portion of the underlying gate dielectric layer within the opening. A gate electrode is formed within opening over the portion of the gate dielectric layer. The remaining nitride layer is selectively removed. The remaining sacrificial oxide layer is then stripped and removed.

23 Claims, 4 Drawing Sheets

METHOD OF PATTERNING GATE ELECTRODES WITH HIGH K GATE DIELECTRICS

FIELD OF THE INVENTION

The present invention relates generally to methods of forming semiconductor devices and specifically to methods of defining poly gate electrodes and forming ultra-thin buffer oxide layers below the SiN gate dielectric in semiconductor device fabrication.

BACKGROUND OF THE INVENTION

Current processes for defining polysilicon (poly) gate electrodes involve the patterning of the gate through photolithography followed by an anisotropic poly etch which stops on the nitride (silicon nitride (SiN)) gate dielectric. However, etch selectivity between poly and nitride is poor hence stopping on the thin nitride gate dielectric becomes a significant problem. Poly edge GOI (gate oxide integrity) may become a problem if trenching of the silicon substrate occurs at the poly edge.

U.S. Pat. No. 5,963,818 to Kao et al. describes a method for forming an integrated circuit involves forming trench isolation regions and a damascene gate electrode region simultaneous with one another by over-lapping process steps using, inter alia, an inverse poly gate CMP.

U.S. Pat. No. 5,960,270 to Misra et al. describes a method for forming a metal gate MOS transistor using an inverse poly gate CMP. Source and drain regions are formed within a substrate self-aligned to a lithographically-patterned feature. The patterned feature is then removed and replaced by a metallic gate layer that is chemically mechanically polished (CMP) to form a metallic plug region that is either an inlaid or dual inlaid. The metallic plug region is self-aligned to the source and drain regions and preferably functions as a metal MOS gate region.

U.S. Pat. No. 5,943,576 to Kapoor describes a method of forming a MOS transistor having a narrow diffusion region that is smaller than the diffusion region defined using photoresist in a conventional CMOS processing. The method includes an inverse poly gate with sidewall spacers process.

U.S. Pat. No. 5,899,719 to Hong describes a method for making an FET (field effect transistor) having narrower gate electrodes and forming source/drain regions, including halo implants, in a more controlled manner. The method includes an inverse poly gate with sidewall spacers process.

U.S. Pat. No. 5,872,038 to Duane et al. describes a process for forming a semiconductor device having an elevated active region. A plurality of gate electrodes is formed on the semiconductor substrate an a thick oxide layer is disposed over the gate electrodes. A trench is formed in the thick oxide layer and is filled with a polysilicon material that is later doped to form an elevated active region above an active region of the substrate. The process includes a plain inverse poly gate CMP process.

SUMMARY OF THE INVENTION

Accordingly, it is an object of the present invention to provide a highly selective etch process for conductive gate patterning on thin gate dielectrics.

Another object of the present invention is to provide a method of defining conductive gate electrodes using a poly CMP instead of a plasma etch to reduce the total amount of plasma damage experienced by the gate dielectric.

Yet another object of the present invention is to provide a method of defining conductive gate electrodes that may result in improved PID (proportional integral derivative) immunity.

Other objects will appear hereinafter.

It has now been discovered that the above and other objects of the present invention may be accomplished in the following manner. Specifically, a silicon substrate having at least one active area is provided. A buffer layer overlies the silicon substrate and a gate dielectric layer overlies the buffer layer. A sacrificial oxide layer is formed over the gate dielectric layer. A nitride layer is formed over the sacrificial oxide layer. The nitride layer is patterned to form an opening therein within the active area exposing a portion of the sacrificial oxide layer within the opening. The portion of the sacrificial oxide layer within the opening is stripped, exposing a portion of the underlying gate dielectric layer within the opening. A gate electrode is formed within opening over the portion of the gate dielectric layer. The remaining nitride layer is selectively removed. The remaining sacrificial oxide layer is then stripped and removed.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all processes, structures, layers, etc. may be performed, formed or accomplished by conventional methods known in the prior art.

Figure 1:
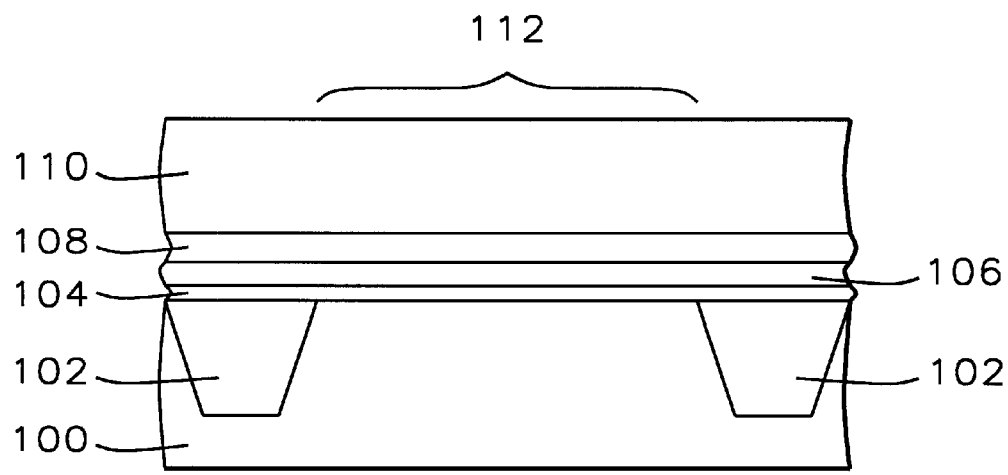
FIGS. 1 to 8 schematically illustrate, in cross-sectional representation, a first preferred option made in accordance with the present invention.

Accordingly, as shown in FIG. 1, starting silicon substrate 100 may include a semiconductor wafer and has shallow isolation trenches (STI) regions 102 formed therein separating active area 112. Although only two STI regions 102 and one active area 112 are illustrated in FIG. 1, it is understood multiple STI regions could be formed within silicon substrate 100 separating multiple active areas.

A buffer layer 104 is formed over the substrate 100 and STI regions 102. Buffer layer 104 may be comprised of $SiO_2$ or SiON, for example. Buffer layer 104 preferably has a thickness of from about 3 to 10 Å and more preferably from about 5 to 8 Å. Buffer layer 104 is preferably formed by either rapid thermal oxidation or chemical growth oxidation.

Gate dielectric layer 106 is then formed over buffer layer 104. Gate dielectric layer 106 may be comprised of silicon nitride (SiN), or a high k dielectric material such as $Ta_3O_5$, $TiO_2$, or $Ta_2O_5$. SiN gate dielectric layer 106 is preferably formed using a Rapid Thermal Nitridation (RTN) process. Gate dielectric layer 106 has a thickness of from about 20 to 50 Å, and more preferably from about 20 to 30 Å.

Thin sacrificial oxide (sac. ox.) layer 108 is then formed over SiN gate dielectric layer 106 to a thickness of from about 120 to 180 Å, more preferably from about 130 to 170 Å, and most preferably about 150 Å.

A thick nitride (SiN) stack/layer 110 is deposited over sac. ox. layer 108 to a thickness from about 2250 to 2750 Å, more preferably from about 2400 to 2600 Å, and most preferably about 2500 Å.

Figure 2:
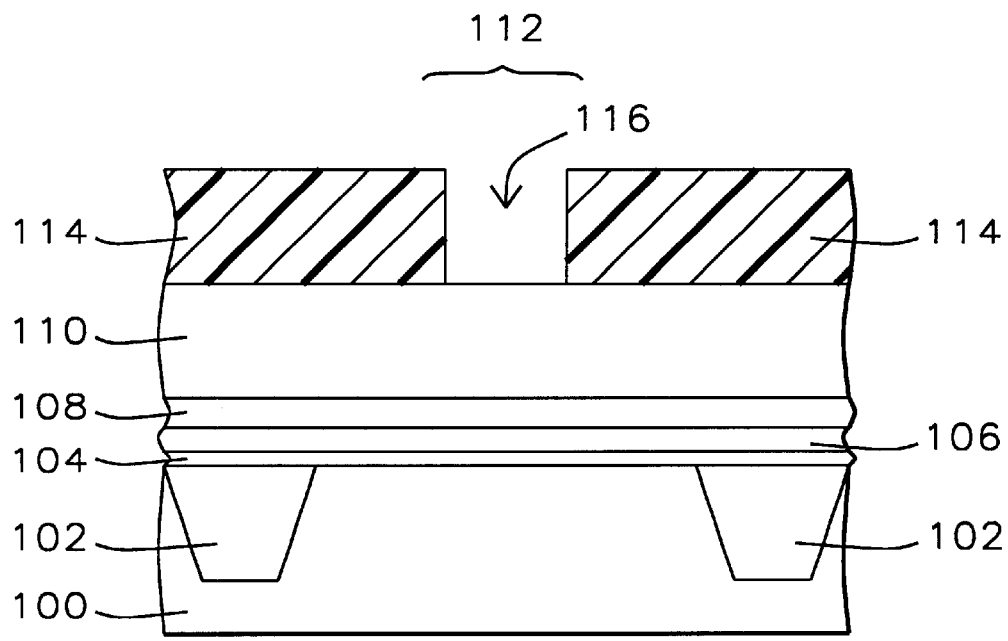

As shown in FIG. 2, a gate reverse mask 114, preferably photoresist, is formed and patterned over nitride layer 110 to form opening 116 in gate reverse mask 114 within active area 112.

Figure 3:
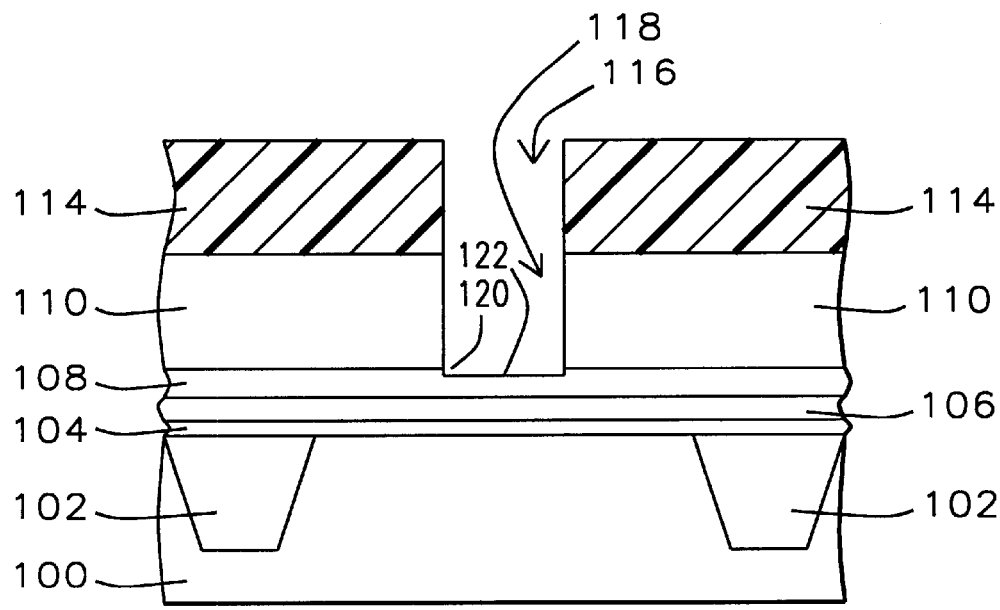

As shown in FIG. 3, an anisotropic nitride etch of nitride layer 110, selective to underlying sac. ox. layer 108, is performed, transferring opening 116 in gate reverse mask 114 to nitride layer 110 as opening 118. Opening 118 corresponds to the width of opening 116.

Opening 118 in nitride layer 110 exposes a portion 122 of sac. ox. layer 108. Since sac. ox. layer 108 is relatively thick (about 150 Å), there is a sufficient margin for any over-etch (such as at 120) without risk of damaging underlying SiN gate dielectric layer 106.

Figure 4:
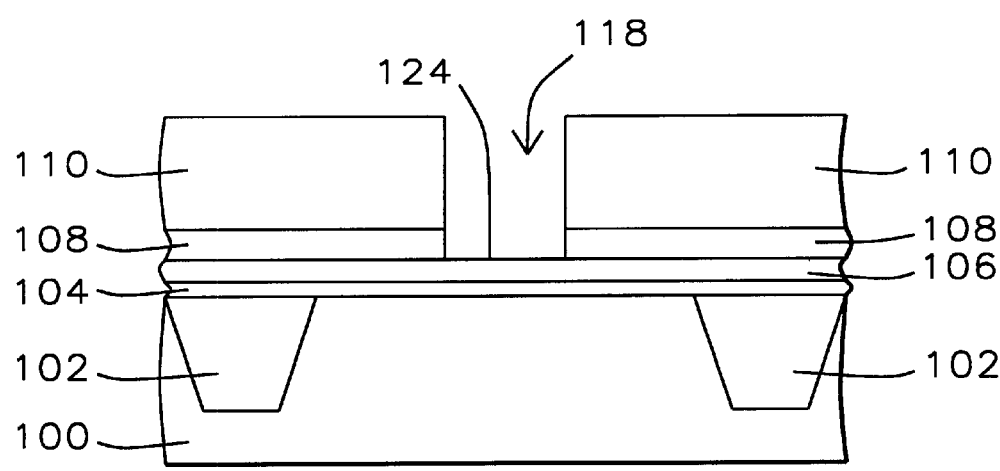

As shown in FIG. 4, photoresist gate reverse mask 114 is stripped.

A short HF oxide strip is then used to remove the remaining exposed sac. ox. layer portion 122 within opening 118 over SiN gate oxide layer 106. This increases the depth of opening 118 and exposes a portion 124 of SiN gate oxide layer 106 within opening 118.

Figure 5:
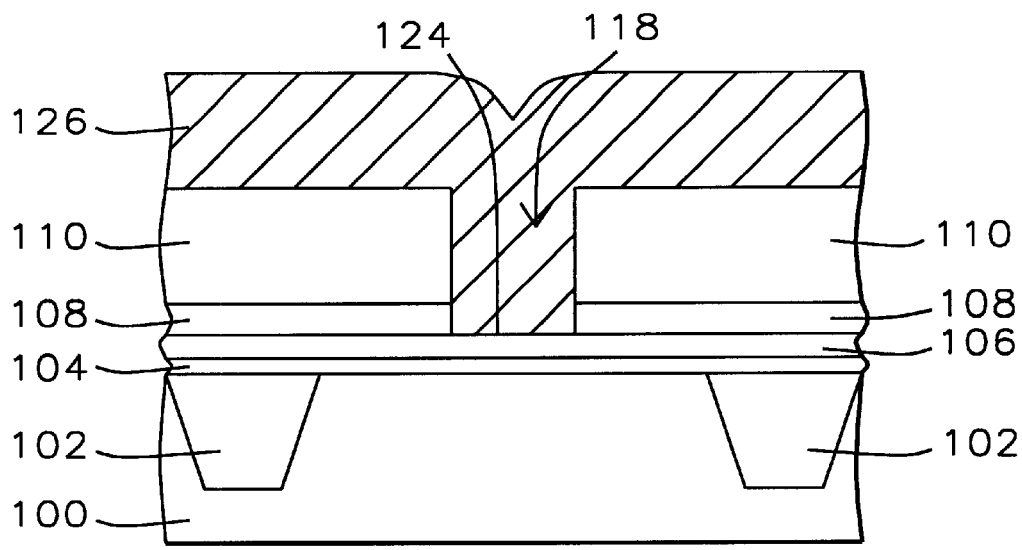

As shown in FIG. 5, a thick conductor layer 126 is deposited over the structure, filling opening 118 and blanket filling nitride layer 110. Conductor layer 126 has a thickness from about 3150 to 3850 Å, more preferably from about 3400 to 3600 Å, and most preferably about 3500 Å. Conductor layer 126 may be polysilicon or a metal, for example.

Figure 6:
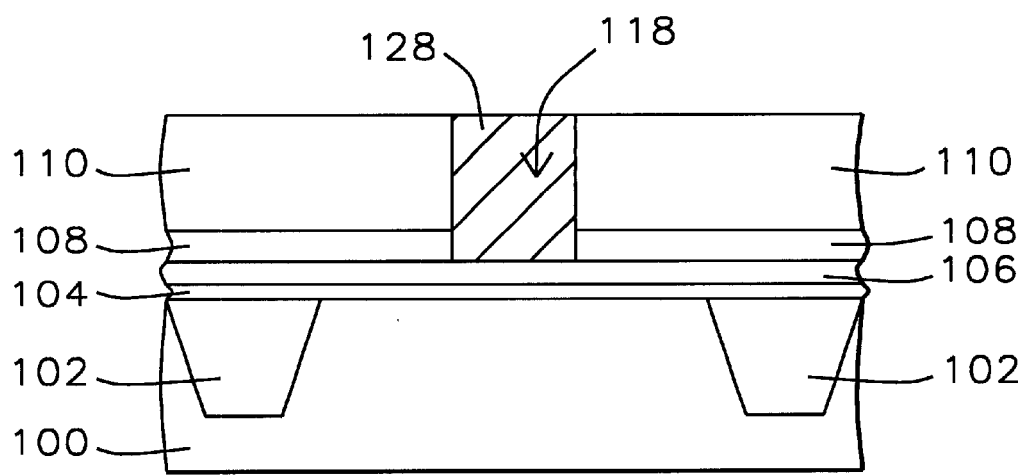

As shown in FIG. 6, conductor layer 126 is polished down to nitride layer 110 to form gate electrode 128 within opening 118. This polishing may be accomplished by a poly chemical-mechanical polishing (CMP) either with or without the aid of a reverse mask (not shown).

Figure 7:
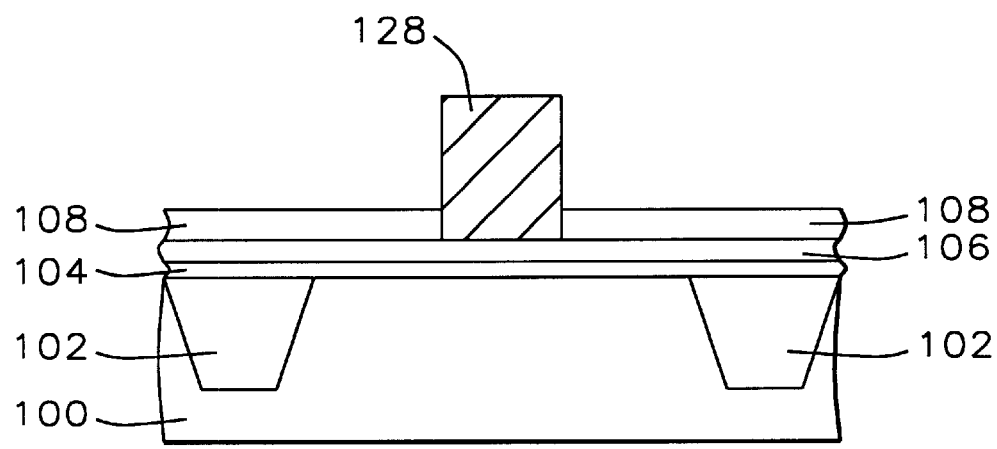

As shown in FIG. 7, nitride layer 110 is then selectively removed by an isotropic phosphoric acid wet etch leaving gate electrode 128 and sac. ox. layer 108 unaffected.

A key feature of the invention is that sac. ox. layer 108 also prevents the hot phosphorous acid from attacking the underlying thin SiN gate dielectric layer 106.

Figure 8:
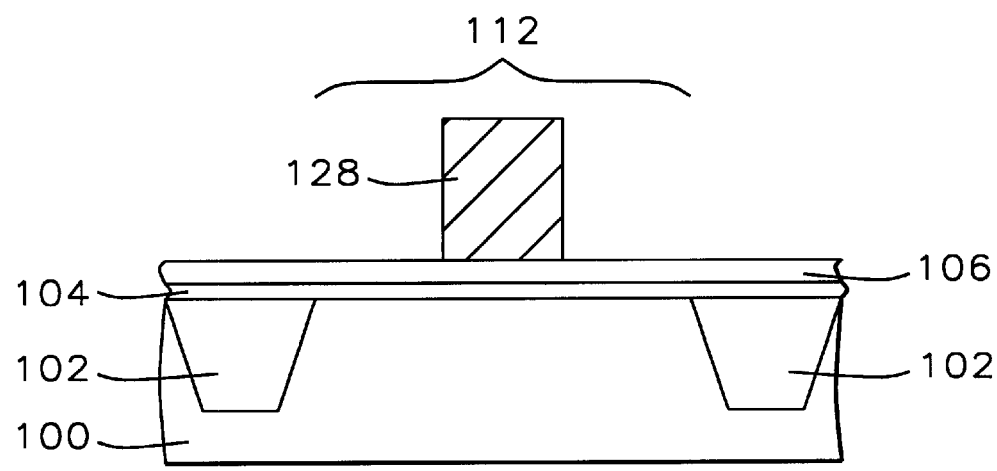

As shown in FIG. 8, a short HF strip is applied to remove sac. ox. layer 108 without affecting thin gate dielectric layer 106.

This method permits a highly selective etch process for conductor gates 128 patterning on thin gate dielectric layers 106. Further, replacing a poly plasma etch with a poly CMP of poly layer 126 to form conductor gate 128 reduces the total amount of plasma damage experience by underlying gate dielectric layer 106. It is believed this may result in improved proportional integral derivative (PID) immunity.

While particular embodiments of the present invention have been illustrated and described, it is not intended to limit the invention, except as defined by the following claims.

We claim:

1. A method of forming a gate electrode, comprising the following steps:

providing a silicon substrate having at least one active area; a buffer layer overlies said silicon substrate and a gate dielectric layer overlies said buffer layer;

forming a sacrificial oxide layer over said gate dielectric layer;

forming a nitride layer over said sacrificial oxide layer;

patterning said nitride layer to form an opening therein within said active area exposing a portion of said sacrificial oxide layer within said opening;

stripping said portion of said sacrificial oxide layer within said opening exposing a portion of said underlying gate dielectric layer within said opening;

forming a gate electrode within said opening over said portion of said gate dielectric layer;

selectively removing said remaining nitride layer; and stripping and removing said remaining sacrificial oxide layer.

2. The method of claim 1, wherein said nitride layer patterning step includes the steps of:

forming and patterning a layer of photoresist over said nitride layer to form a gate reverse mask; and etching said nitride layer through said gate reverse mask to form said nitride layer opening within said active area.

3. The method of claim 1, wherein said buffer layer is from about 3 to 10 Å thick; said gate dielectric layer is from about 10 to 50 Å thick; said sacrificial oxide layer is from about 120 to 180 Å thick; and said nitride layer is from 2250 to 2750 Å thick.

4. The method of claim 1, wherein said buffer layer is from about 3 to 10 Å thick; said gate dielectric layer is from about 20 to 25 Å thick; and said nitride layer is from 2400 to 2600 Å thick.

5. The method of claim 1, wherein said gate dielectric layer is comprised of SiN; and said buffer layer and said SiN gate dielectric layer are formed through Rapid Thermal Nitridation.

6. The method of claim 1, wherein said gate electrode formation step includes the steps of:

depositing a conductor layer over the structure filling said nitride layer opening and blanket filing said nitride layer;

chemically-mechanically polishing said conductor layer, removing the conductor layer over said nitride layer and forming said gate electrode.

7. The method of claim 1, wherein said select removal of said remaining nitride layer comprises an isotropic phosphoric acid wet etch of said remaining nitride layer.

8. The method of claim 1, wherein said select stripping of said remaining sacrificial oxide layer comprises an HF strip.

9. A method of forming a gate electrode, comprising the following steps:

providing a silicon substrate having at least one active area; a buffer layer overlies said silicon substrate and a gate dielectric layer overlies said buffer layer; said buffer layer being from about 3 to 10 Å thick; said gate dielectric layer being from about 10 to 50 Å thick;

forming a sacrificial oxide layer over said gate dielectric layer;

forming a nitride layer over said sacrificial oxide layer; said nitride layer being from about 2250 to 2750 Å thick;

patterning said nitride layer to form an opening therein within said active area exposing a portion of said sacrificial oxide layer within said opening;

stripping said portion of said sacrificial oxide layer within said opening exposing a portion of said underlying gate dielectric layer within said opening;

forming a gate electrode within said opening over said portion of said gate dielectric layer;

selectively removing said remaining nitride layer; and stripping and removing said remaining sacrificial oxide layer.

10. The method of claim 9, wherein said nitride layer patterning step includes the steps of:

forming and patterning a layer of photoresist over said nitride layer to form a gate reverse mask; and etching said nitride layer through said gate reverse mask to form said nitride layer opening within said active area.

11. The method of claim 9, wherein said gate dielectric layer is from about 20 to 25 Å thick; and said nitride layer is from 2400 to 2600 Å thick.

12. The method of claim 9, wherein said gate dielectric layer is comprised of SiN, and said buffer layer and said gate dielectric layer are formed through Rapid Thermal Nitridation.

13. The method of claim 9, wherein said gate electrode formation step includes the steps of:

depositing a conductor layer over the structure filling said nitride layer opening and blanket filing said nitride layer;

chemically-mechanically polishing said conductor layer, removing the conductor layer over said nitride layer and forming said gate electrode.

14. The method of claim 9, wherein said select removal of said remaining nitride layer comprises an isotropic phosphoric acid wet etch of said remaining nitride layer.

15. The method of claim 9, wherein said select stripping of said remaining sacrificial oxide layer comprises an HF strip.

16. The method of claim 9, wherein said buffer layer is comprised of a material selected from the group comprising $SiO_2$ and SiON; said gate dielectric layer is comprised of a material selected from the group comprising SiN, $Ta_3O_5$, $TiO_2$, and $Ta_2O_5$; and said gate electrode is comprised of a material selected from the group comprising polysilicon and a metal.

17. A method of forming a gate electrode, comprising the following steps:

providing a silicon substrate having at least one active area; a buffer layer overlies said silicon substrate and a gate dielectric layer overlies said buffer layer; said buffer layer being from about 3 to 10 Å thick; said gate dielectric layer being from about 10 to 50 Å thick;

forming a sacrificial oxide layer over said gate dielectric layer;

forming a nitride layer over said sacrificial oxide layer; said nitride layer being from about 2250 to 2750 Å thick;

forming and patterning a layer of photoresist over said nitride layer to form a gate reverse mask;

etching said nitride layer through said gate reverse mask to form an opening therein within said active area exposing a portion of said sacrificial oxide layer within said opening;

stripping said portion of said sacrificial oxide layer within said opening exposing a portion of said underlying gate dielectric layer within said opening;

forming a gate electrode within said opening over said portion of said gate dielectric layer;

selectively removing said remaining nitride layer; and stripping and removing said remaining sacrificial oxide layer.

18. The method of claim 17, wherein said gate dielectric layer is from about 20 to 25 Å thick; and said nitride layer is from 2400 to 2600 Å thick.

19. The method of claim 17, wherein said gate dielectric layer is comprised of SiN, and said buffer layer and said gate dielectric layer are formed through Rapid Thermal Nitridation.

20. The method of claim 17, wherein said gate electrode formation step includes the steps of:

depositing a conductor layer over the structure filling said nitride layer opening and blanket filing said nitride layer;

chemically-mechanically polishing said conductor layer, removing the conductor layer over said nitride layer and forming said gate electrode.

21. The method of claim 17, wherein said select removal of said remaining nitride layer comprises an isotropic phosphoric acid wet etch of said remaining nitride layer.

22. The method of claim 17, wherein said select stripping of said remaining sacrificial oxide layer comprises an HF strip.

23. The method of claim 17, wherein said buffer layer is comprised of a material selected form the group comprising $SiO_2$ and SiON; said gate dielectric layer is comprised of a material selected from the group comprising SiN, $Ta_3O_5$, $TiO_2$, and $Ta_2O_5$; and said gate electrode is comprised of a material selected from the group comprising polysilicon and a metal.

* * * * *